United States Patent
Piquette et al.

(10) Patent No.: US 11,552,228 B2
(45) Date of Patent: Jan. 10, 2023

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Alan Piquette, Kensington, NH (US); Maxim N. Tchoul, Winchester, MA (US); Darshan Kundaliya, Middleton, MA (US); Adam Scotch, Amesbury, MA (US); Gertrud Kräuter, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 68 days.

(21) Appl. No.: 16/104,743

(22) Filed: Aug. 17, 2018

(65) Prior Publication Data
US 2020/0056091 A1 Feb. 20, 2020

(51) Int. Cl.
*H01L 33/50* (2010.01)
*H01L 33/56* (2010.01)

(52) U.S. Cl.
CPC ............ *H01L 33/56* (2013.01); *H01L 33/502* (2013.01); *H01L 33/505* (2013.01); *H01L 33/507* (2013.01); *H01L 2933/005* (2013.01); *H01L 2933/0033* (2013.01); *H01L 2933/0041* (2013.01)

(58) Field of Classification Search
CPC ....... H01L 33/56; H01L 33/50; H01L 33/501; H01L 33/502; H01L 21/02216; H01L 51/5252; H01L 51/5268; H01L 51/5237; H01L 51/0035
See application file for complete search history.

(56) References Cited

U.S. PATENT DOCUMENTS

| | | | |
|---|---|---|---|
| 7,471,040 B2 | 12/2008 | Nishimura | |
| 9,985,186 B2 | 5/2018 | Mahowald | |
| 10,902,770 B2 | 1/2021 | Iguchi et al. | |
| 10,923,634 B2 | 2/2021 | Piquette et al. | |
| 2006/0203468 A1* | 9/2006 | Beeson | H01L 33/60 362/84 |
| 2012/0018761 A1 | 1/2012 | Honda | |

(Continued)

FOREIGN PATENT DOCUMENTS

| CN | 102361953 A | 2/2012 | |
|---|---|---|---|
| CN | 106206871 A * | 12/2016 | H01L 33/50 |

(Continued)

*Primary Examiner* — Michele Fan
(74) *Attorney, Agent, or Firm* — Slater Matsil, LLP

(57) ABSTRACT

An optoelectronic component and a method for producing an optoelectronic component are disclosed. In an embodiment an optoelectronic component includes a semiconductor chip including a plurality of pixels, each pixel configured to emit electromagnetic primary radiation from a radiation exit surface and conversion layers located on at least a part of the radiation exit surfaces, wherein the conversion layers comprise a crosslinked matrix having a three-dimensional siloxane-based network and at least one phosphor embedded in the matrix, and wherein the conversion layers have a thickness of ≤30 μm.

19 Claims, 2 Drawing Sheets

(56) References Cited

U.S. PATENT DOCUMENTS

| | | | |
|---|---|---|---|
| 2012/0261688 A1* | 10/2012 | Raukas | H01L 33/505 257/98 |
| 2014/0175488 A1 | 6/2014 | Kashiwagi et al. | |
| 2014/0367633 A1* | 12/2014 | Bibi | G02F 1/133603 257/13 |
| 2015/0188007 A1* | 7/2015 | Mochizuki | H01L 33/56 257/98 |
| 2016/0293805 A1* | 10/2016 | Choi | H01L 33/505 |
| 2017/0062680 A1* | 3/2017 | Yoo | H01L 33/32 |
| 2017/0152419 A1* | 6/2017 | Rantala | H01L 27/323 |
| 2018/0340119 A1 | 11/2018 | Piquette et al. | |
| 2019/0181306 A1* | 6/2019 | Juang | H01L 33/507 |
| 2019/0244937 A1 | 8/2019 | Honjo et al. | |
| 2019/0259919 A1 | 8/2019 | Piquette et al. | |
| 2019/0322837 A1 | 10/2019 | Tchoul et al. | |

FOREIGN PATENT DOCUMENTS

| | | | | |
|---|---|---|---|---|
| CN | 106876562 A | * | 6/2017 | ........... H01L 27/156 |
| CN | 107302010 A | * | 10/2017 | ............ H01L 27/15 |
| EP | 3098266 A1 | | 11/2016 | |
| JP | 2006054470 A | | 2/2006 | |
| JP | 2009076749 A | | 4/2009 | |
| JP | 2011181429 A | | 9/2011 | |
| JP | 2014122296 A | | 7/2014 | |
| JP | 2016521013 A | | 7/2016 | |
| JP | 2016197760 A | | 11/2016 | |
| JP | 2017157724 A | | 9/2017 | |
| JP | 2017212301 A | | 11/2017 | |
| JP | 2019522818 A | | 8/2019 | |
| WO | 2010110204 A1 | | 9/2010 | |
| WO | 2017182390 A1 | | 10/2017 | |
| WO | WO-2017182390 A1 | * | 10/2017 | ............ H01L 33/56 |
| WO | 2018002334 A | | 1/2018 | |
| WO | 20180116814 A1 | | 6/2018 | |

\* cited by examiner

OPTOELECTRONIC COMPONENT AND METHOD FOR PRODUCING AN OPTOELECTRONIC COMPONENT

TECHNICAL FIELD

The present disclosure relates to an optoelectronic component and a method for producing an optoelectronic component.

BACKGROUND

In certain light-emitting diode (LED) or laser diode (LD) lighting applications, such as automotive forward lighting, display lighting, or information protection, there is a need to be able to finely pixelate the light source in order to precisely guide, and actively change, where the light is directed. If the necessary pixel for a given application is, for example, less than approximately 300 µm in length, there is a need to be able to place a conversion element comprising a phosphor material in close proximity to the pixelated light source like, for example, a pixelated LED, while maintaining optical separation between neighboring pixels in order to prevent crosstalk. In this context, crosstalk refers to how much light, generated by one pixel, spreads through a conversion element to neighboring pixels. Further requirements on conversion elements of pixelated lighting applications are, for example, color uniformity and thermal stability.

For example, known ceramic, single crystal, and thin-film-based conversion elements cannot produce the required spectrum from a single conversion element, e.g., a down conversion element, if more than one phosphor is needed. Additionally, they all require a glue layer, which is disadvantageous for crosstalk and thermal management. Single crystals may not even be able to work for single phosphor applications, because they can tolerate only very little activator ion within themselves. At such low thicknesses, depending on the phosphor, it may not be possible to incorporate enough activator to reach the desired color point. Phosphor-in-silicone, phosphor-in-glass, and phosphor-on-glass down-converting elements can accommodate multiple phosphor compositions, i.e., phosphor blends, with some restrictions, but the phosphor-in/on-glass options require a glue layer with the disadvantages mentioned above.

Known red LED or laser diode phosphors are based on nitride hosts. The nitrides are easily damaged when exposed to elevated temperatures in air. Even the lowest melting glasses require hundreds of degrees Celsius to make them flowable, so it is not straightforward to include a nitride phosphor in-glass without at least some damage being done to the phosphor. While red phosphors are easily mixed into standard silicone matrixes, those matrixes are not stable under the high heat and flux conditions needed.

Micro-pixelated lighting applications with a pixel size of approximately 300 µm require conversion elements to be very thin, i.e., ≤20 µm. Such a low thickness creates complications with traditional converter element types. Single crystal, ceramic, and the phosphor-in/on-glass converters are all very fragile at those thicknesses, which would make the handling difficult, if not impossible. The thin-film-type phosphor is normally deposited on a carrier wafer to circumvent the handling difficulty, but the carrier wafer must be later removed by an additional step, which is possible but expensive and challenging.

SUMMARY

Embodiments provide an optoelectronic component with improved properties and a method for producing an optoelectronic component with improved properties.

According to one aspect an optoelectronic component is provided. The component comprises a semiconductor chip comprising a multiplicity of pixels, each pixel emitting electromagnetic primary radiation from a radiation exit surface, wherein on at least a part of the radiation exit surfaces conversion layers are applied, wherein the conversion layers comprise a crosslinked matrix having a three-dimensional siloxane-based network and at least one phosphor embedded in said matrix, wherein the conversion layers have a thickness of ≤30 µm, preferably ≤20 µm.

The electromagnetic primary radiation may be a visible radiation or an invisible radiation. According to one embodiment the electromagnetic primary radiation is a visible radiation, for example, with wavelengths in the blue spectrum. The pixels of the semiconductor chip may emit the same electromagnetic primary radiation.

The conversion layer is to be understood as a layer that absorbs, at least partially, the electromagnetic primary radiation and then emits an electromagnetic secondary radiation. The wavelength ranges of the primary and the secondary radiation can be distinct from each other or there could be a significant overlap between the absorbed and the emitted wavelengths. The absorption and the emission of wavelength is performed by the at least one phosphor incorporated in the conversion layer. According to one embodiment the electromagnetic secondary radiation comprises wavelengths being longer than the wavelength of the electromagnetic primary radiation. In this case the conversion layer is a down-conversion layer.

The conversion layer may according to one embodiment be made separately on a substrate, for example, and then incorporated into the optoelectronic component in a subsequent step. According to another embodiment, it is produced in situ on each pixel of the semiconductor chip of the optoelectronic component.

The pixels of the semiconductor chip may be understood as individually controllable portions of the semiconductor chip, each emitting electromagnetic primary radiation. According to one embodiment all pixels emit blue radiation.

The conversion layers being applied on at least a part of the radiation exit surfaces are, according to one embodiment, in direct mechanical contact to the semiconductor chip.

"On at least a part of the radiation exit surfaces" is to be understood here and in the following, that at least some of the pixels of the semiconductor chip comprise a conversion layer. In one embodiment, all pixels comprise a conversion layer.

Each conversion layer may comprise a size conforming to the size of one pixel, i.e., to the cross-section of one pixel. In other words, each conversion layer is in mechanical contact with only one pixel of the semiconductor chip.

According to one embodiment the optoelectronic component is a micro-pixelated optoelectronic component. Thus, each pixel may have a size of ≤300 µm in length.

The conversion layer of the optoelectronic component may fulfil all of the requirements for the application in a pixelated, especially a micro-pixelated, light source. Thus, it has a thickness of ≤30 µm, preferably ≤20 µm, and is placed directly on the radiation exit surface of the semiconductor chip. Further, it provides a broad spectrum of emitted wavelength providing a color-on-demand by the possibility to incorporate one phosphor or a blend of phosphors. Its fabrication process does not require high temperature or solvents, so that the conversion layer is compatible with nearly all phosphors and their mixtures, so that different colors from blue to red, including combinations, for example, cool- and warm-white blends, are possible. This is in contrast to common ceramic, single-crystal and deposition-derived thin-film converters, where phosphor blends are not applicable.

Due to the direct placement on the radiation exit surface of the semiconductor chip, the crosstalk between the pixels is minimized compared to a situation where a converter layer has to be glued on a semiconductor chip.

Even the long-term stability against moisture and under high incident blue light flux, i.e., the electromagnetic primary radiation, of ≥1.5 A/mm² may be improved with the conversion layer of the optoelectronic component.

Additionally, the color uniformity from pixel-to-pixel may also be improved with this conversion layer. Allowable differences in color points from pixel-to-pixel could vary by application and pixel resolution, but as with other light sources, it is desired that most people would not be able to tell the difference between the colors of the light generated by different pixels. A rough guideline would be that all the pixels within the device should have color points that fit within a three-step MacAdam ellipse. This is challenging for conversion layers, especially down conversion layers, composed of phosphor particles in a polymer matrix, where the particles have similar sizes to the thickness of the conversion layer.

According to another embodiment the pixels comprise a pixel-to-pixel period of ≤125 μm. Thus, the optoelectronic component may be a micro-pixelated lighting application.

According to one embodiment, the crosslinked matrix comprises an organic content of less than 40 wt % of the conversion layer. In a preferred embodiment, the organic content is less than or equal to 20 wt % of the conversion layer. For example, the organic content is about 15 wt %. This is a greatly reduced organic content in contrast to that being found in a typical methyl silicone with D-unit type bonding. The reduced organic content can be obtained by an increased number of crosslinks in the matrix and a reduced number of side chains by using a (poly)siloxane that is based, primarily, on T-unit bonding. Here D-unit and T-unit refer to the relative number of oxygen and carbon atoms bonded to each silicon atom in the (poly)siloxane. A D-unit describes the bonding situation where the silicon atom is bonded to two oxygens and two carbons. A T-unit describes the bonding situation where the silicon atom is bonded to three oxygens and one carbon.

In lighting applications such as automotive forward lighting and projection, the high light fluxes lead to high temperatures. These high temperatures require that the materials which are in close proximity, as is the case for the conversion layers, are thermally stable for the lifetime of the device, which is expected to be up to 10,000 hours or even longer. Standard optical silicones are not ideal as a phosphor matrix for this reason. They are a limiting factor in this technology because the temperature must be kept below 150 to 200° C. or they will rapidly degrade.

Due to the relatively low amount of organic material in the three-dimensional network of the conversion layer it may be more thermally stable than an analogous material based on a standard optical silicon matrix having an organic content of about 60 wt %. The thermal stability may be a long-term temperature stability even at temperatures of more than 200° C.

According to one embodiment the crosslinked matrix is made from a precursor material comprising a precursor having a structure chosen from one of the generic formulae

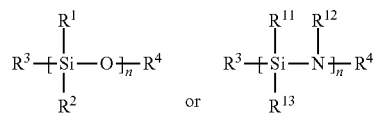

wherein $R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl, and combinations thereof, wherein $R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, wherein $R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof, and $R^1$ and $R^2$ and $R^{11}$, $R^{12}$ and $R^{13}$ comprise an alkoxy content being in the range from 10 wt % to 50 wt % of the total formula.

In other words, the precursor material for the crosslinked matrix comprises a substituted polysiloxane precursor or a substituted polysilazane precursor. The backbone of the polysiloxane precursor comprises alternating silicon and oxygen atoms, the backbone of the polysilazane precursor comprises alternating silicon and nitrogen atoms. Typically, the precursor is a liquid at room temperature if it is a polysiloxane. In some cases, a small amount of solvent is needed for the polysilazane precursor for it to be in liquid-type form. The three-dimensional network is formed from the liquid or solution-based precursor. When cured, the material is a highly cross-linked network, primarily made up of siloxane bonds.

$R^1$ and $R^2$ and, respectively, $R^{11}$, $R^{12}$ and $R^{13}$ are according to one embodiment chosen from a group consisting of methyl, methoxy, ethyl, ethoxy, phenyl, phenoxy, vinyl, and trifluoropropyl. In a further embodiment, $R^1$ and $R^2$ and, respectively, $R^{11}$, $R^{12}$ and $R^{13}$ are independently from each other methyl and methoxy.

According to another embodiment, $R^1$ and $R^2$ and, respectively, $R^{11}$, $R^{12}$ and $R^{13}$ comprise an alkoxy content, for example, a methoxy content, in the range of from 10 wt % to 50 wt %, advantageously in the range of 15 wt % to 45 wt %, even more advantageously in the range of 20 wt % to 40 wt %. For example, a repeating unit of a precursor may comprise the generic formula, wherein the number of repeat units n can vary and an exemplary methoxy content is about 32 wt %:

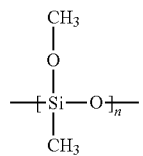

Any other combination of a polysiloxane backbone or a polysilazane backbone with alkyl, for example, methyl, and alkoxy, for example, methoxy, side groups is possible as well. For example, there could be a silicon atom being substituted with two methyl groups or two methoxy groups as long as the total alkoxy content of all precursor compounds in the precursor material falls within the above-mentioned ranges to have enough reactive groups for building the cross-linked matrix.

The precursor material can also be partially reacted and comprise an exemplary structure as shown in the generic formula:

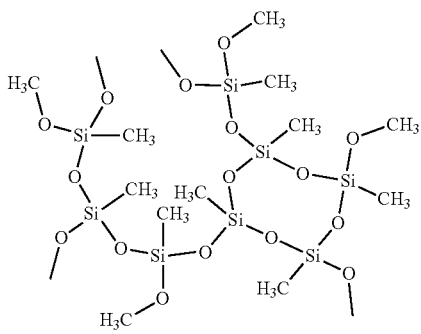

The dangling bonds could indicate a continuation of the structure or a terminal group. In a partially reacted precursor, the methoxy content will be lower than for the unreacted precursor, and the viscosity can thus be higher.

The terminal groups of the polysiloxane precursor and the polysilazane precursor, i.e., $R^3$ and $R^4$, comprise according to an embodiment independently from each other chemically reactive groups such as, for example, alkoxy, vinyl, hydroxyl, carboxylic acid, ester, or any other of the reactive functional groups known from organic chemistry field. In other embodiments, the terminal groups could be less reactive, such as hydrogen, methyl, ethyl or any other alkyl or aryl groups.

The properties of the matrix and, thus, of the conversion layer, can be tuned by modifying the precursor material. In the above shown precursor units, the reactive group is an alkoxy group which can be equally represented by $R^1$, $R^2$, $R^{11}$, $R^{12}$, and/or $R^{13}$. Apart from the groups $R^1$, $R^2$, $R^{11}$, $R^{12}$, and $R^{13}$, the terminal groups $R^3$ and $R^4$ can be varied as well as the number of repeating units n. Even with this number n, the properties of the matrix material can be changed. For example, a lower n will generally lead to a lower viscosity and a higher n will lead to a higher viscosity of the precursor.

The repeating number n is according to one embodiment chosen such that the viscosity of the precursor is in the range of 1 to 150 mPas, advantageously in the range of 1 to 60 mPas, and even more advantageously in the range of 2 to 40 mPas. For example, in case of methyl methoxy polysiloxane may be less than 40 mPas. Thus, low molecular weight precursors are provided. For example, n might be chosen to be <10. Due to the relatively low viscosity of the precursor a high concentration of phosphors in the matrix is possible.

Another generic formula of the reactive polysiloxane precursor is:

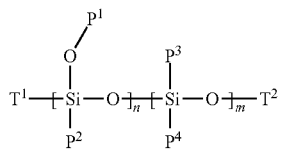

$T^1$ and $T^2$ represent terminal groups being equal to $R^3$ and $R^4$ of the above-shown generic formula. $P^1$, $P^2$, $P^3$ and $P^4$ are side groups. The indices n and m represent the relative number fractions of the corresponding monomeric groups in the precursor formula. It is $0<n\leq1$ and $0\leq m<1$, and $n+m=1$. In some embodiments, the P-groups and T-groups could all be the same, e.g., a methyl group. In other embodiments, each functional group could be a different group. In still other embodiments, some of the groups could be the same and some could be different. In some cases one of the groups could be made up of more than one functional group. All the definitions for substituents and properties correspond to the definitions and properties as mentioned with respect to the generic formulae of the precursor material shown above.

For example, according to one embodiment it is m=0, $P^1$=methyl, and $P^2$=methyl.

According to one embodiment it is m=0, $P^1$=methyl, and $P^2$ is a combination of methyl and phenyl.

According to another example of the polysiloxane precursor m=0, $P^2$ is either a methyl, a phenyl or a combination of the two, $P^1$ is ethyl, with an ethoxy content of 10 to 50 wt %, but more preferably 20 to 30 wt %, and a viscosity in the range of 30 to 70 mPas. A small amount of solvent may be present in this embodiment.

According to another example of the polysiloxane precursor m=0, $P^2$ is a combination of methyl and phenyl, and pi is a methyl group. A methoxy content of 10 to 20 wt % is preferred, along with a viscosity of 50 to 150 mPas.

According to one embodiment, the crosslinked matrix comprises a three-dimensional siloxane-based network having the generic formula

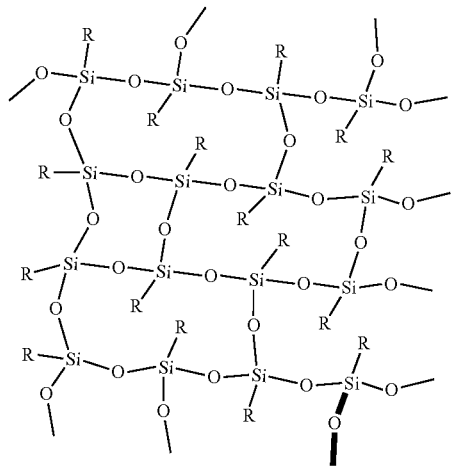

wherein each R is—independently from each other—chosen from a group consisting of a group listed for $R^1$, $R^2$, $R^3$, $R^4$, $R^{11}$, $R^{12}$, $R^{13}$, or any combination thereof, and the dangling bonds are—independently from each other—representative of a continuation of the network or one of the groups listed for $R^1$, $R^2$, $R^3$, $R^4$, $R^{11}$, $R^{12}$, $R^{13}$. Such a crosslinked matrix material may result independently if a polysiloxane precursor or a polysilazane precursor is used to form the matrix material. The three-dimensional siloxane-based network is a cured material.

A possible siloxane-based network based on a methyl methoxy polysiloxane precursor that could result if all the methoxy groups participate in crosslinking is shown in the following generic formula:

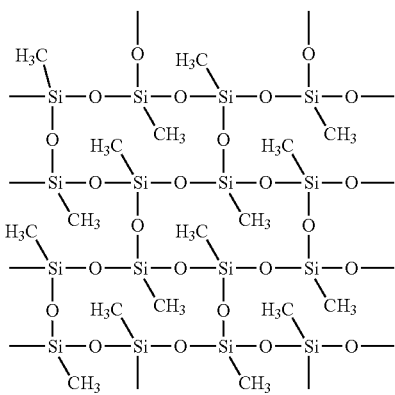

It is to be noted that the structure shown above is a stylized example that is easy to visualize, but it is not meant to be technically accurate. Thus, not necessarily all of the methoxy groups would result in crosslinking, for example. Some of them might remain intact and some of them might be replaced by silanol groups.

According to one embodiment, the precursor material additionally comprises at least one additive that is chosen from a group consisting of catalysts, nanoparticles, metal-organic compounds, organic molecules, organic polymers, inorganic polymers, and combinations thereof.

As the precursor material generally is a liquid, it is easily possible to incorporate the additives into the conversion layer. The additives can serve different purposes, such as controlling the viscosity during the fabrication, providing crack resistance and enhanced mechanical strength, tuning the refractive index or increasing the thermal connectivity.

According to one embodiment the catalyst comprises a titanium alkoxide, for example, tetra-n-butyl titanate. This is a typical catalyst for the curing of a precursor to a cross-linked matrix additionally to water or humidity. The tetra-n-butyl titanate may not be strictly necessary since the presence of liquid water or gaseous humidity is sometimes sufficient for the curing step to get a crosslinked matrix depending on the embodiment. A typical amount of the catalyst being added to the precursor material may be from 0.5 wt % to 5 wt %.

Other additives can be added to the precursor material in order to influence the processability of the precursor and/or the final properties of the highly crosslinked matrix and, thus, of the conversion layer.

According to one embodiment, the nanoparticles can be chosen from a group consisting of oxides, like silicon dioxide ($SiO_2$), zirconium dioxide ($ZrO_2$), titanium dioxide ($TiO_2$), aluminum oxide ($Al_2O_3$), or zinc oxide (ZnO), nitrides, like aluminum nitride (AlN), silicon nitride ($Si_3N_4$), or boron nitride (BN), carbon-based nanoparticles, like carbon nanotubes, graphene or their derivatives, heteropoly acids like 12-tungstophosphoric acid ($H_3PW_{12}O_{40}$) and 12-tungstosilicic acid ($H_4SiW_{12}O_{40}$) and any combinations thereof.

According to one embodiment, the precursor material additionally comprises fumed silica. The content of fumed silica may be in the range of 5 wt % to 40 wt %, preferably between 15 wt % and 35 wt %. The given ranges are to be understood as being with respect to the fully cured polysiloxane material or the crosslinked matrix. For example, fumed silica may be added as additive, in order to thicken the slurry of precursor and phosphor after the addition of the at least one phosphor. Other nanoparticles may be added to change the refractive index or thermal conductivity, for example.

In some cases, to make them compatible, the surfaces of the inorganic nanoparticles are modified with capping agents to make them miscible with the precursor compound.

According to one embodiment, the metal-organic compounds are chosen from a group consisting of titanium alkoxides, zirconium alkoxides, aluminum alkoxides, silicon alkoxides, halfnium alkoxides, and any combination thereof.

According to one embodiment, the organic molecules are chosen from a group consisting of adhesion promotors, plasticizers, de-foamers, thickeners, or thinners.

According to another embodiment, the organic polymers and the inorganic polymers are chosen from a group consisting of poly(dimethyl siloxane), poly(methylphenyl siloxane), poly(diphenyl siloxane), poly(silphenylene-siloxane), polyphosphazenes, polysilazane, perhydropolysilazane.

The relative amounts of phosphor and additives in the precursor may depend on criteria like the size of the particles, the desired color point, the volume and thickness of the conversion layer, the wavelength of the primary radiation, the type of lighting source, the amounts of other additive materials, and other considerations.

According to another embodiment the precursor material additionally comprises some D-unit type bonding, wherein the content of the D-unit bonding is between 0 mol % and 30 mol % of all the siloxane units. Thus, additionally to T-unit bondings where a silicon atom is bonded to three oxygen atoms, D-unit bondings, where a silicon atom is bonded to two oxygen atoms may be present.

According to another embodiment the precursor material has a molecular weight of less than 3000 g/mol, preferably less than too g/mol.

According to another embodiment, the at least one phosphor is chosen from a group consisting of $(RE_{1-x}Ce_x)_3(Al_{1-y}A'_y)_5O_{12}$ with $0<x\le0.1$ and $0\le y\le1$, $(RE_{1-x}Ce_x)_3(Al_{5-2y}Mg_ySi_y)O_{12}$ with $0<x\le0.1$ and $0\le y\le2$, $(RE_{1-x}Ce_x)_3Al_{5-y}Si_yO_{12-y}N_y$ with $0<x\le0.1$ and $0\le y\le0.5$, $(RE_{1-x}Ce_x)_2CaMg_2Si_3O_{12}:Ce^{3+}$ with $0<x\le0.1$, $(AE_{1-x}Eu_x)_2Si_5N_8$ with $0<x\le0.1$, $(AE_{1-x}Eu_x)AlSiN_3$ with $0<x\le0.1$, $(AE_{1-x}Eu_x)_2Al_2Si_2N_6$ with $0<x\le0.1$, $(Sr_{1-x}Eu_x)LiAl_3N_4$ with $0<x\le0.1$, $(AE_{1-x}Eu_x)_3Ga_3N_5$ with $0<x\le0.1$, $(AE_{1-x}Eu_x)Si_2O_2N_2$ with $0<x\le0.1$, $(AE_xEu_y)Si_{12-2x-3y}Al_{2x+3y}O_yN_{16-y}$ with $0.2\le x\le2.2$ and $0<y\le0.1$, $(AE_{1-x}Eu_x)SiO_4$ with $0<x\le0.1$, $(AE_{1-x}Eu_x)_3Si_2O_5$ with $0<x\le0.1$, $K_2(Si_{1-x-y}Ti_yMn_x)F_6$ with $0<x\le0.2$ and $0<y\le1-x$, $(AE_{1-x}Eu_x)_5(PO_4)_3Cl$ with $0<x\le0.2$, $(AE_{1-x}Eu_x)Al_{10}O_{17}$ with $0<x\le0.2$, $(Y_{1-x-y}Gd_xCe_y)_3Al_5O_{12}$ with $0\le x\le0.2$ and $0<y\le0.05$, and combinations thereof, wherein RE is one or more of Y, Lu, Tb and Gd, AE is one or more of Mg, Ca, Sr, Ba, A' is one or more of Sc and Ga, wherein the phosphors optionally include one or more of halides. These phosphors are able to absorb in the near-UV to blue region of the electromagnetic spectrum and emit in the visible region of the electromagnetic spectrum.

The phosphor may be added to the precursor material in the form of a powder. The concentration of the phosphor or the phosphor blend may be equal to or smaller than 90 wt % of the mixture, for example, in the range of 15 wt % to 75 wt %, of the phosphor-in-polysiloxane or phosphor-in-polysilazane converter material at the un-cured stage.

According to another embodiment, the conversion layer comprises a top surface facing away from the semiconductor chip and a bottom surface facing the semiconductor chip, wherein the top surface and/or the bottom surface is structured. Structured means in this context that the surface is modified, for example, to improve the outcoupling of light.

According to one embodiment, the structured surface comprises random roughness, a microlense, a microlense array, a micro-optic, a photonic crystal, a plasmonic array, a meta lense, aperiodic nanostructured arrays, a dielectric film, a stack of dielectric films, or a graded index anti-reflective coating. The stack of dielectric films comprises, for example, anti-reflective coatings, dichroic filters, and wavelength or angle-dependent pass filters.

The surface modifications may be imparted to the conversion layer during its production either by starting with a structured or patterned substrate on which the precursor material is applied or after curing by post-processing steps.

According to another embodiment the optoelectronic component is an LED or a laser diode.

According to another aspect, a method is provided for producing an optoelectronic component. The method comprises the steps of: providing a semiconductor chip with a multiplicity of pixels, each pixel emitting electromagnetic primary radiation from a radiation exit surface, preparing a starting mixture comprising at least one phosphor and a precursor material, wherein the precursor material comprises a precursor having a structure that is chosen from one of the generic formulae:

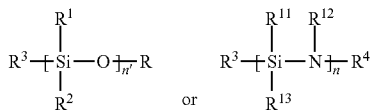

wherein $R^1$ and $R^2$ are—independently from each other—chosen from a group consisting of alkyl, alkoxy, aryl, aryloxy, alkenyl, substituted alkyl, substituted alkoxy, substituted aryl, substituted aryloxy, substituted alkenyl, and combinations thereof, wherein $R^{11}$, $R^{12}$ and $R^{13}$ are—independently from each other—chosen form a group consisting of H, alkyl, alkoxy, aryl, aryloxy, alkenyl, substituted alkyl, substituted alkoxy, substituted aryl, substituted aryloxy, substituted alkenyl, and combinations thereof, wherein $R^3$ and $R^4$ are—independently from each other—chosen from a group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof, wherein n is chosen such that the viscosity of the precursor is in the range of 1 to 150 mPas, and wherein $R^1$ and $R^2$ and $R^{11}$, $R^{12}$ and $R^{13}$ comprise an alkoxy content being in the range from 10 wt % to 50 wt %, applying the starting mixture onto at least a part of the radiation exit surfaces of the pixels or on a temporary substrate, and curing the starting mixture to get a conversion layer being applied on at least a part of the radiation exit surfaces, comprising a crosslinked matrix comprising the phosphor dispersed in said matrix, wherein the conversion layer is applied in a thickness of ≤30 μm, preferably ≤20 μm.

The method is suitable to produce an optoelectronic component according to the above-mentioned embodiments. Thus, all features disclosed with respect to the optoelectronic component are valid for the method and vice versa.

This method is an inexpensive process which is conductible at room temperature to produce an optoelectronic component with a conversion layer. Further, the starting mixture can be applied directly on the pixels of the semiconductor chip and thus the conversion layer is produced in situ on each pixel or on the desired pixels of the semiconductor chip.

"Applying the starting mixture onto at least a part of the radiation exit surfaces of the pixels" is to be understood that the starting mixture is applied separately on each pixel of the semiconductor chip, namely on the radiation exit surface of each pixel or on the radiation exit surface of the pixels where a conversion layer is desired.

According to another embodiment the starting mixture is applied on a temporary substrate, cured on the temporary substrate, and glued to the radiation exit surface of at least one of the pixels of the semiconducting chip, wherein, after gluing, the temporary substrate is removed. Thus, the starting mixture is applied on a temporary substrate and cured to form a conversion layer with a thickness of ≤30 μm. This conversion layer is glued on the radiation exit surface of at least one pixel of the semiconductor chip and could be glued to as many as all of the pixels of a given pixelated semiconductor chip and, after gluing, the temporary substrate is removed.

For the application of the starting mixture a solvent can be used or a solvent-free approach can be performed. When preparing the starting mixture, at least one phosphor is mixed into the precursor material. Depending on the viscosity, a solvent may or may not be added to the starting mixture. If a solvent is needed, many organic solvents will work, such as, for example, xylene or butyl acetate.

According to another embodiment, at least one additive is added to the starting mixture, said additive being chosen from a group consisting of catalysts, nanoparticles, metal-organic compounds, organic molecules, organic polymers, inorganic polymers and combinations thereof. The additives may be chosen from additives mentioned above with respect to the optoelectronic component.

According to another embodiment, the application of the starting mixture onto at least a part of the radiation exit surfaces of the pixels or on the temporary substrate takes place by a method chosen from a group consisting of screen printing, stencil printing, spray coating, and ink jetting. With these methods an exact application of the conversion layer material onto the single pixels is possible.

To adapt the size of the conversion layer to the size of a pixel, the portions of the semiconductor chip where no starting mixture is to be applied can be coated with a photoresist or capped with a patterned cover, for example. When using ink jetting a local application of the starting mixture is even possible.

According to another embodiment the curing takes place at room temperature or at elevated temperatures. The curing time can be reduced by exposing the starting mixture to elevated temperatures for a few hours. According to an embodiment, the curing takes place when exposing the starting mixture to water or humidity. During the curing alcohol may be produced as a by-product leading to a densification of the matrix material.

According to another embodiment the application of the starting mixture onto at least a part of the radiation exit surfaces is repeated at least once. Thus, the desired thickness in a range of ≤30 μm, preferably ≤20 μm, can be hit.

BRIEF DESCRIPTION OF THE DRAWINGS

Additional advantages, advantageous embodiments and developments are explained in the following in connection with the figures and examples.

In the examples and figures, like parts are designated by like numerals. The depicted parts and their proportions are not to scale, rather some parts as, for example, layers, may be depicted exaggeratedly large in order to improve presentability.

DETAILED DESCRIPTION OF ILLUSTRATIVE EMBODIMENTS

Figure 1:
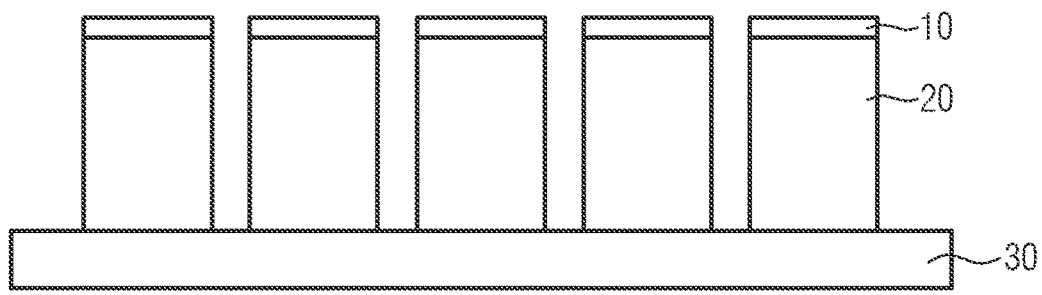
FIG. 1 shows a schematic cross-section of an optoelectronic component.

FIG. 1 shows a schematic cross-section of an optoelectronic component having a substrate 30, a semiconductor chip 20 being pixelated and conversion layers 10. The pixel-to-pixel period may be ≤125 µm. The size of a pixel may be in the range of 300 µm.

The optoelectronic component may be an LED package or a laser diode-based light source. Not explicitly shown in FIG. 1 are the active layer sequence of the semiconductor chip 20 and additional elements like a housing or a reflective sealing material surrounding the semiconductor chip 20.

The semiconductor chip emits a primary electromagnetic radiation, for example, in the near-UV to blue spectrum. Each pixel of the semiconductor chip 20 is individually controllable. The conversion layer 10 absorbs the primary electromagnetic radiation at least partially and converts it to a secondary radiation being different from the primary radiation. The emission of light of each pixel is composed of the combination of primary and secondary radiation.

The wavelength of the secondary radiation depends on the phosphor or blend of phosphors embedded in the matrix of the conversion layer. Each conversion layer may have a different secondary radiation, i.e., the emission of light from each pixel may be different from other pixels.

The conversion layers 10 are applied on the radiation exit surface of the pixels of the semiconductor chip, the radiation exit surface facing away from the substrate 30 on which the semiconductor chip 20 is applied. Not on all of the pixels of the semiconductor chip 20 are necessarily conversion layers 10 if partially no conversion is desired (not shown).

According to an exemplary embodiment of the conversion layer a methoxymethyl polysiloxane is made or purchased as a precursor material. The methoxy content should be in the order of 10 to 50 wt %, preferably in the range of 15 to 45 wt %, even more preferably in the range of 30 to 40 wt %. The molecular weight should be such that the viscosity is in the range of 1 to 50 mPas, but preferably in the range of 2 to 40 mPas. Other polysiloxanes or polysilazanes with various substituents as mentioned above are possible as well.

For a cool white application such as an automotive forward lighting, a YAG:Ce-type phosphor would be chosen as a down conversion material to be incorporated into the precursor material to prepare a starting mixture. For a warm-white, for example, a high CRI lighting application, the phosphor mixture could be a blend of cerium-activated, lutetium aluminum garnet $(Lu_{1-x}Ce_x)Al_5O_{12}$, where $0<x\leq 0.2$, and an europium-activated, calcium aluminum silicon nitride $(Ca_{1-x}Eu_x)AlSiN_3$ where $0<x\leq 0.2$ may be provided as phosphor powders to be incorporated to the liquid precursor material. Generally, other phosphors or blends of phosphors as mentioned above are possible as well, depending on the application and color targets.

The concentration, and ratio of the phosphors depends on the cerium and europium concentrations, the phosphors absorbances and quantum efficiencies, the target thickness of the conversion layer, the target color point of the optoelectronic component and if there are other scattering additives present. The ratio of garnet to nitride phosphor is typically within the range of 2.5:1 to 4.5:1.

Further additives may be added to the starting mixture comprising the precursor and the phosphor blend or the phosphor blend. Depending on the viscosity a solvent may be added or fumed silica may be added if a thickening of the slurry is desired. Other additives may be added additionally or alternatively in order to change the refractive index or thermal conductivity. Further a hardener such as a titanium alkoxide may be added in the range of 0.5 wt % to 5 wt %.

Regardless of the color target or phosphor composition, the slurry comprising the starting mixture is sprayed onto the pixelated semiconductor chip 20 where the phosphor concentration and layer thickness are chosen to hit the target color point, but the final thickness of the conversion layer must remain at or below the 30 µm height limit.

Once sprayed on the pixels of the semiconductor chip 20, the starting mixture may be cured at room temperature or elevated temperatures to form a highly cross-linked matrix with the phosphors embedded therein. The curing can take place after the exposure to water or humidity. The spraying is performed separately, i.e., the pixels of the semiconductor chip 20 are provided with a conversion layer 10 separately from each other.

The application of the starting material onto the pixels of the semiconductor chip 20 generally can be performed by methods like screen printing, stencil printing, spray coating or ink jetting.

Figure 2:
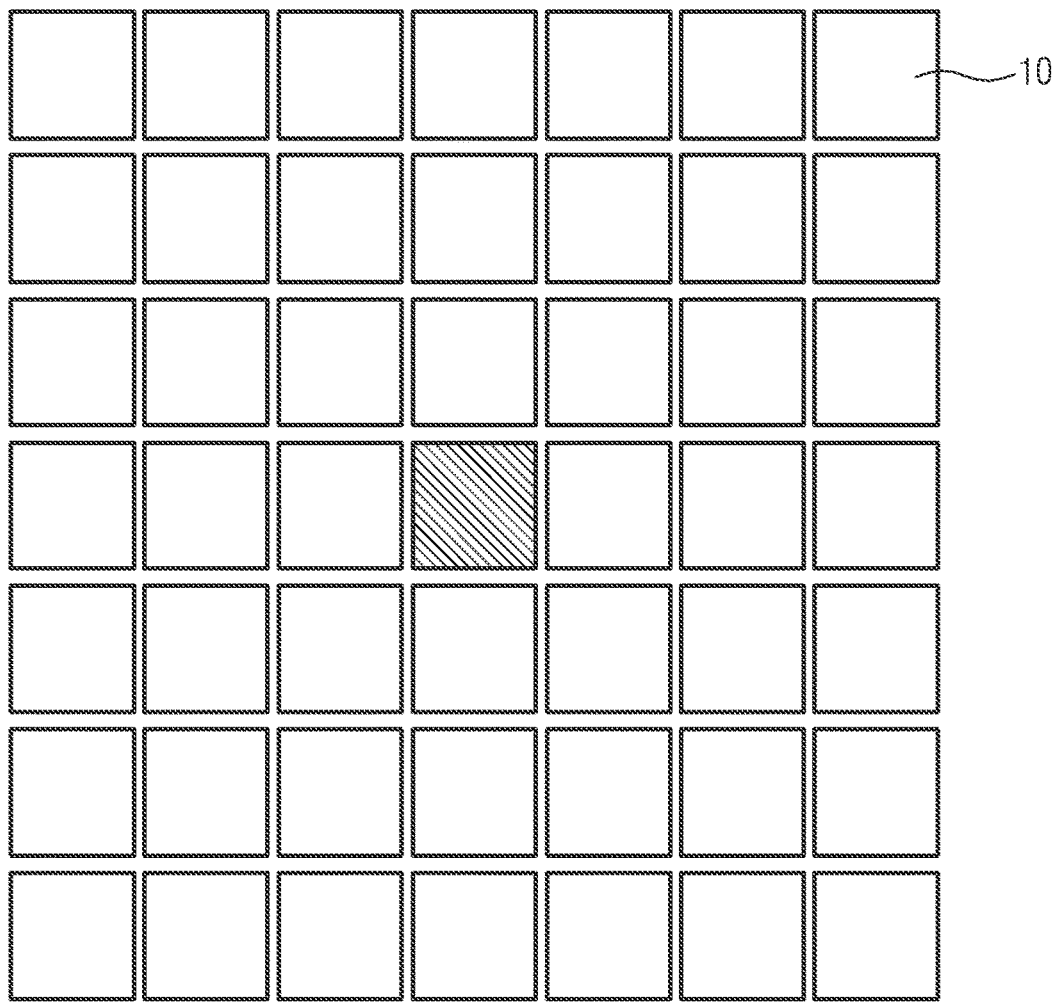
FIG. 2 shows a schematic top view on an optoelectronic component.

FIG. 2 refers to a top view of an optoelectronic component where the top surfaces of the conversion layers 10 are shown. One of the conversion layers 10 is applied onto a pixel of the semiconductor chip 20, wherein this central pixel is on. This pixel is indicated by hatches in FIG. 2. In this example, the semiconductor chip 20 comprises a 7×7 array of micro-pixels. Crosstalk among the pixels of the semiconductor chip is measured by how much light can be detected at neighboring pixels of the hatched pixel, i.e., the pixel that is on. Due to the conversion layer 10 of the optoelectronic component the desired value of crosstalk is accomplished, that is the brightness measured at a pixel with a distance of two pixels between this pixel and the hatched pixel is not greater than 200 times less than the brightness of the hatched pixel. This low crosstalk is realized by the low thickness of ≤30 µm of the conversion layer 10 as well as its direct application on the semiconductor chip 20.

Figure 3:
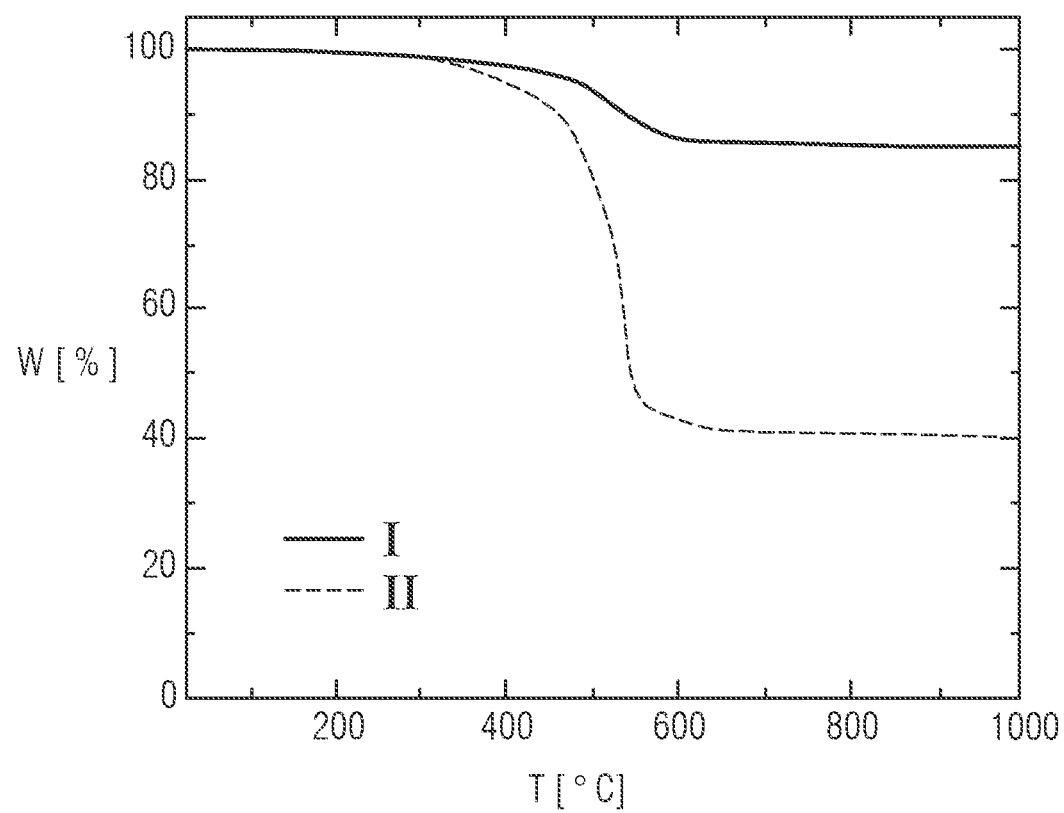
FIG. 3 shows thermogravimetric analysis profiles of a comparative matrix material and matrix material of a conversion layer according to an exemplary embodiment.

FIG. 3 shows a thermogravimetric analysis profile of a comparative methyl-based silicone (II) in comparison to a methyl-based polysiloxane (I). The x-axis shows the temperature T in ° C., The y-axis shows the weight W in percent. The standard silicone reference (II) loses almost 60% of its weight indicating a large organic content. In contrast, the polysiloxane material (I) loses less than 20% of its weight indicating a significantly lower organic content. This leads to the enhanced thermal stability of the conversion layer in comparison to analogous materials based on standard optical silicone matrixes.

The scope of the application of the present disclosure is not limited to the examples given hereinabove. The present disclosure is embodied in each novel characteristic and each combination of characteristics, which particularly includes every combination of any features which are stated in the claims, even if this feature or this combination of features is not explicitly stated in the claims or in the examples.

What is claimed is:

1. An optoelectronic component comprising:
a semiconductor chip comprising:
a plurality of pixels, each pixel configured to emit electromagnetic primary radiation from a radiation exit surface; and
conversion layers located directly on at least a part of the radiation exit surfaces, each conversion layer having a size conforming to a cross-section of one pixel,
wherein the conversion layers comprise a crosslinked matrix having a three-dimensional siloxane-based network and at least one phosphor embedded in the matrix,
wherein the conversion layers have a thickness of ≤3 µm,
wherein the crosslinked matrix is made from a precursor material comprising a precursor having a structure chosen from one of the generic formulae:

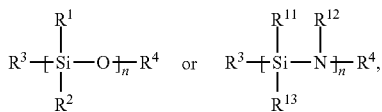

wherein $R^1$ and $R^2$ are—independently from each other—selected from the group consisting of alkyl, alkoxy, aryl, aryloxy, alkenyl, substituted alkyl, substituted alkoxy, substituted aryl, substituted aryloxy, substituted alkenyl and combinations thereof,
wherein $R^{11}$, $R^{12}$ and $R^{13}$ are—independently from each other—selected from the group consisting of H, alkyl, alkoxy, aryl, aryloxy, alkenyl, substituted alkyl, substituted alkoxy, substituted aryl, substituted aryloxy, substituted alkenyl, and combinations thereof,
wherein $R^3$ and $R^4$ are—independently from each other—selected from the group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof,
wherein $R^1$ and $R^2$ and $R^{11}$, $R^{12}$ and $R^{13}$ comprise an alkoxy content being in a range between 10 wt % and 50 wt % of the total formula,
wherein the conversion layers comprise a top surface facing away from the semiconductor chip and a bottom surface facing the semiconductor chip, the top and/or the bottom surface being structured, and
wherein the structured surfaces comprises a random roughness.

2. The optoelectronic component according to claim 1, wherein the pixels comprise a pixel-to-pixel period of ≤125 µm.

3. The optoelectronic component according to claim 1, wherein the crosslinked matrix comprises an organic content of less than 40 wt % of the conversion layers.

4. The optoelectronic component according to claim 1, wherein the crosslinked matrix comprises an organic content of less than or equal to 20 wt % of the conversion layers.

5. The optoelectronic component according to claim 1, wherein the precursor material further comprises at least one additive that is selected from the group consisting of catalysts, nanoparticles, metal-organic compounds, organic molecules, organic polymers, inorganic polymers, and combinations thereof.

6. The optoelectronic component according to claim 1, wherein the precursor material further comprises fumed silica, and wherein a content of the fumed silica is in a range of 5 wt % to 40 wt %.

7. The optoelectronic component according to claim 1, wherein the precursor material further comprises a D-unit type bonding, and wherein a content of the D-unit bonding is between 0 mol % and 30 mol % of all siloxane units.

8. The optoelectronic component according to claim 1, wherein the precursor material has a molecular weight of less than 3000 g/mol.

9. The optoelectronic component according to claim 1, wherein the three-dimensional siloxane-based network has the generic formula:

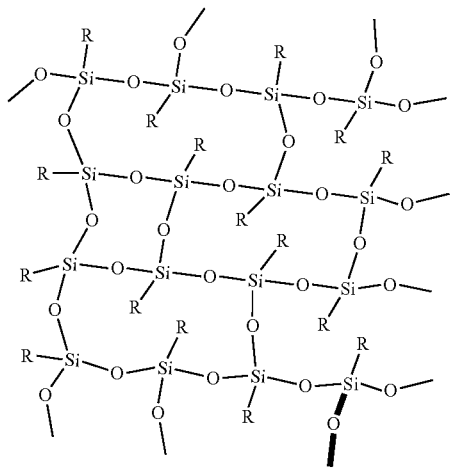

wherein each R is—independently from each other—selected from the group consisting of the groups for $R^1$, $R^2$, $R^3$, $R^4$, $R^{11}$, $R^{12}$, and $R^{13}$, and any combination thereof, and dangling bonds are—independently from each other—representative of a continuation of the network or one of the groups for $R^1$, $R^2$, $R^3$, $R^4$, $R^{11}$, $R^{12}$, and $R^{13}$.

10. The optoelectronic component according to claim 1, wherein the at least one phosphor is selected from the group consisting of:
$(RE_{1-x}Ce_x)_3(Al_{1-y}A'_y)_5O_{12}$ with $0<x\leq0.1$ and $0\leq y\leq1$,
$(RE_{1-x}Ce_x)_3(Al_{5-2y}Mg_ySi_y)O_{12}$ with $0<x\leq0.1$ and $0\leq y\leq2$,
$(RE_{1-x}Ce_x)_3Al_{5-y}Si_yO_{12-y}N_y$ with $0<x\leq0.1$ and $0\leq y\leq0.5$,
$(RE_{1-x}Ce_x)_2CaMg_2Si_3O_{12}:Ce^{3+}$ with $0<x\leq0.1$,
$(AE_{1-x}Eu_x)_2Si_5N_8$ with $0<x\leq0.1$,
$(AE_{1-x}Eu_x)AlSiN_3$ with $0<x\leq0.1$,
$(AE_{1-x}Eu_x)_2Al_2Si_2N_6$ with $0<x\leq0.1$,
$(Sr_{1-x}Eu_x)LiAl_3N_4$ with $0<x\leq0.1$,
$(AE_{1-x}Eu_x)_3Ga_3N_5$ with $0<x\leq0.1$,
$(AE_{1-x}Eu_x)Si_2O_2N_2$ with $0<x\leq0.1$,
$(AE_xEu_y)Si_{12-2x-3y}Al_{2x+3y}O_yN_{16-y}$ with $0.2\leq x\leq2.2$ and $0<y\leq0.1$,
$(AE_{1-x}Eu_x)_2SiO_4$ with $0<x\leq0.1$,
$(AE_{1-x}Eu_x)_3Si_2O_5$ with $0<x\leq0.1$,
$K_2(Si_{1-x-y}Ti_yMn_x)F_6$ with $0<x\leq0.2$ and $0<y\leq1-x$,
$(AE_{1-x}Eu_x)_5(PO_4)_3Cl$ with $0<x\leq0.2$,
$(AE_{1-x}Eu_x)Al_{10}O_{17}$ with $0<x\leq0.2$,
$(Y_{1-x-y}Gd_xCe_y)_3Al_5O_{12}$ with $0\leq x\leq0.2$ and $0<y\leq0.05$, and
combinations thereof, wherein RE is one or more of Y, Lu, Tb or Gd,
wherein AE is one or more of Mg, Ca, Sr, or Ba, and
wherein A' is one or more of Sc or Ga.

11. The optoelectronic component according to claim 1, wherein the structured surface comprises a micro-lens, a micro-lens array, a micro-optic, a photonic crystal, a plasmonic array, a meta lens, aperiodic nanostructured arrays, a dielectric film, a stack of dielectric films, or a graded index anti-reflective coating.

12. The optoelectronic component according to claim 1, wherein the optoelectronic component is an LED or a laser diode.

13. A method for producing an optoelectronic component, the method comprising:
providing a semiconductor chip with a plurality of pixels, each pixel configured to emit electromagnetic primary radiation from a radiation exit surface;
preparing a starting mixture comprising at least one phosphor and a precursor material, wherein the precursor material comprises a precursor having a structure that is chosen from one of the generic formulae:

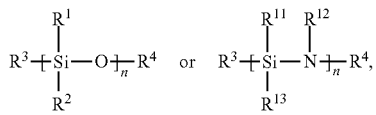

wherein $R^1$ and $R^2$ are—independently from each other—selected from the group consisting of alkyl, alkoxy, aryl, aryloxy, alkenyl, substituted alkyl, substituted alkoxy, substituted aryl, substituted aryloxy, substituted alkenyl, and combinations thereof,
wherein $R^{11}$, $R^{12}$ and $R^{13}$ are—independently from each other—chosen form the group consisting of H, alkyl, alkoxy, aryl, aryloxy, alkenyl, substituted alkyl, substituted alkoxy, substituted aryl, substituted aryloxy, substituted alkenyl, and combinations thereof,
wherein $R^3$ and $R^4$ are—independently from each other—selected from the group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof,
wherein n is chosen such that a viscosity of the precursor is in a range of 1 to 150 mPas, and
wherein $R^1$ and $R^2$ and $R^{11}$, $R^{12}$ and $R^{13}$ comprise an alkoxy content being in a range from 10 wt % to 50 wt %;
applying the starting mixture directly on at least a part of the radiation exit surfaces of the pixels or on a temporary substrate; and
curing the starting mixture to form a conversion layer on at least the part of the radiation exit surfaces, each conversion layer having a size conforming to a cross-section of one pixel,
wherein the conversion layer comprises a crosslinked matrix having the phosphor dispersed in the matrix,
wherein the conversion layer comprises a thickness of ≤30 µm,
wherein the conversion layer comprises a top surface facing away from the semiconductor chip and a bottom surface facing the semiconductor chip, the top and/or the bottom surface being structured, and
wherein the structured surfaces comprises a random roughness.

14. The method according to claim 13, further comprising adding to the starting mixture at least one additive, wherein the additive is selected from the group consisting of catalysts, nanoparticles, metal-organic compounds, organic molecules, organic polymers, inorganic polymers, and combinations thereof.

15. The method according to claim 13, wherein applying the starting mixture on at least the part of the radiation exit surfaces or on the temporary substrate comprises applying a method selected from the group consisting of screen printing, stencil printing, spray coating, and ink jetting.

16. The method according to claim 13, wherein curing takes place at room temperature or at elevated temperatures.

17. The method according to claim 13, wherein the starting mixture is applied on the temporary substrate, cured on the temporary substrate, and glued to the radiation exit surface of at least one of the pixels of the semiconducting chip, and wherein, after gluing, the temporary substrate is removed.

18. The method according to claim 13, wherein applying the starting mixture on at least the part of the radiation exit surfaces is repeated at least once.

19. An optoelectronic component comprising:
a semiconductor chip comprising:
a plurality of pixels, each pixel configured to emit electromagnetic primary radiation from a radiation exit surface; and
conversion layers located directly on at least a part of the radiation exit surfaces, each conversion layer having a size conforming to a cross-section of one pixel,
wherein the conversion layers comprise a crosslinked matrix having a three-dimensional siloxane-based network and at least one phosphor embedded in the matrix,
wherein the conversion layers have a thickness of ≤30 µm,
wherein the crosslinked matrix is made from a precursor material comprising a precursor having a structure chosen from one of the generic formulae:

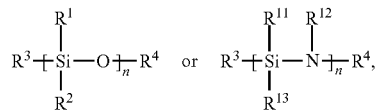

wherein $R^1$ and $R^2$ are—independently from each other—selected from the group consisting of alkyl, alkoxy, aryl, aryloxy, alkenyl, substituted alkyl, substituted alkoxy, substituted aryl, substituted aryloxy, substituted alkenyl and combinations thereof,
wherein $R^{11}$, $R^{12}$ and $R^{13}$ are—independently from each other—selected from the group consisting of H, alkyl, alkoxy, aryl, aryloxy, alkenyl, substituted alkyl, substituted alkoxy, substituted aryl, substituted aryloxy, substituted alkenyl, and combinations thereof,
wherein $R^3$ and $R^4$ are—independently from each other—selected from the group consisting of alkoxy, vinyl, hydroxyl, carboxylic acid, ester, H, alkyl, aryl, substituted alkoxy, substituted carboxylic acid, substituted ester, substituted vinyl, substituted alkyl, substituted aryl, and combinations thereof,
wherein $R^1$ and $R^2$ and $R^{11}$, $R^{12}$ and $R^{13}$ comprise an alkoxy content being in a range between 10 wt % and 50 wt % of the total formula, wherein the conversion layers comprise a top surface facing away from the semiconductor chip and a bottom surface facing the semiconductor chip, the top and/or the bottom surface being structured, and wherein the structured surface comprises a micro-lens, a micro-lens array, a micro-optic, a photonic crystal, a plasmonic array, a meta lens, aperiodic nanostructured arrays, a dielectric film, or a graded index anti-reflective coating.

* * * * *

UNITED STATES PATENT AND TRADEMARK OFFICE
CERTIFICATE OF CORRECTION

| | |
|---|---|
| PATENT NO. | : 11,552,228 B2 |
| APPLICATION NO. | : 16/104743 |
| DATED | : January 10, 2023 |
| INVENTOR(S) | : Alan Piquette et al. |

It is certified that error appears in the above-identified patent and that said Letters Patent is hereby corrected as shown below:

In the Claims

Claim 1, Column 13, Line 18; delete "3" and insert --30--.

Claim 13, Column 15, Line 36; delete "chosen form" and insert --selected from--.

Signed and Sealed this
Seventh Day of February, 2023

Katherine Kelly Vidal
*Director of the United States Patent and Trademark Office*